(12) United States Patent
Pamperin

(10) Patent No.: US 7,847,590 B2
(45) Date of Patent: Dec. 7, 2010

(54) LEVEL SHIFTER INCLUDING CASCODE SETS

(75) Inventor: Jill Marie Pamperin, Peyton, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/263,542

(22) Filed: Nov. 3, 2008

(65) Prior Publication Data
US 2010/0109705 A1 May 6, 2010

(51) Int. Cl.
*H03K 19/094* (2006.01)
(52) U.S. Cl. .......................................... 326/68; 326/81
(58) Field of Classification Search .................. 326/68, 326/80–83, 86, 87; 327/333
See application file for complete search history.

(56) References Cited

U.S. PATENT DOCUMENTS

| 5,821,800 A * | 10/1998 | Le et al. ..................... 327/333 |
| 2004/0090259 A1 * | 5/2004 | Randazzo et al. ............ 327/333 |
| 2005/0275444 A1 * | 12/2005 | Khan et al. .................. 327/333 |
| 2009/0115456 A1 * | 5/2009 | Chiang ......................... 326/80 |

\* cited by examiner

*Primary Examiner*—Rexford N Barnie
*Assistant Examiner*—Jany Tran

(57) ABSTRACT

A device for shifting voltage levels includes an input stage, an output stage and multiple cascode sets connected between the input stage and the output stage. The input stage includes input transistors connected to a first voltage and an input for receiving an input signal. The output stage includes output transistors connected to a second voltage and an output for outputting an output signal having a voltage level different from a corresponding voltage level of the input signal. Each cascode set includes corresponding cascode transistors gated to a third voltage, which is between the first voltage and the second voltage, preventing excessive voltage across terminals of the input transistors and the output transistors.

11 Claims, 4 Drawing Sheets

LEVEL SHIFTER INCLUDING CASCODE SETS

BACKGROUND

Generally, a level translator or level shifter is provided between digital circuits to shift a voltage level of an input signal to a different output level. The digital circuits may require the different voltage levels for respective operations. For example, the voltage levels may define logic values of a signal (e.g., logic 1 or logic 0), and the different digital circuits may define logic values differently. For example, one circuit may require a voltage level greater than 3.3V for logic 1, while another circuit may require a voltage level greater than 5V for logic 1.

In integrated circuit (IC) design, each transistor of a semiconductor is able to withstand a certain maximum voltage across any two terminals of that transistor (e.g., source to drain, gate to source, gate to drain). The maximum voltage may be set by the semiconductor manufacturing process, for example. Typically, an IC is designed to include supply voltages that exceed the maximum voltage that individual transistors are able to handle. Accordingly, the voltage level must be reduced, for example, using level shifting circuits. However, a level shifting circuit creates a complex configuration requiring a constant current draw.

FIG. 1 is a circuit diagram illustrating an example of a conventional level shifter 100. The level shifter 100 is connected to a high voltage source which provides high level voltage Vhigh and a low voltage source which provides low level voltage Vlow. The level shifter 100 includes PMOS transistors 121 and 122 and NMOS transistors 111 and 112, which may be field effect transistors (FETs), for example. Transistor 121 includes a source connected to Vhigh, a gate connected to output Out1, and a drain connected to complementary output Out1$b$, and transistor 122 includes a source connected to Vhigh, a gate connected to Out1 and a drain connected to Out1$b$. Transistor 111 includes a source connected to Vlow, a drain connected Out1$b$ and a gate connected to input In1, and transistor 112 includes a source connected to Vlow, a drain connected to Out1 and a gate connected to complementary input In1$b$.

Assuming for purposes of illustration that Vlow=−3.3V, Vhigh=3.3V and In1 receives a digital input signal having a swing of −3.3V to 0V, Out1 would provide a digital output signal having a swing from 3.3V to −3.3V. If an inverter (not shown) were connected to Out1 with supplies at +3.3V and 0V, the output signal of the inverter would swing from 3.3V to 0V. In this manner, the input signal having a swing of −3.3V to 0V may be converted or shifted to an (inverted) output signal having a swing of 0V to 3.3V. However, in most IC processes, no transistor can handle more than 5V across any two terminals, for example. However, in the configuration of FIG. 1, each of the transistors (e.g., transistors 111, 112, 121 and 122) experiences 6.6V at least across its source to drain connections at some point during operation of the level shifter 100.

SUMMARY

In a representative embodiment, a device for shifting voltage levels includes an input stage, an output stage and multiple cascode sets. The input stage includes a multiple input transistors connected to a first voltage and an input for receiving an input signal. The output stage includes multiple output transistors connected to a second voltage and an output for outputting an output signal having a voltage level different from a corresponding voltage level of the input signal. The multiple cascode sets are connected between the input stage and the output stage. Each cascode set includes corresponding cascode transistors gated to a third voltage, between the first voltage and the second voltage, preventing excessive voltage across terminals of the input transistors and the output transistors.

In another representative embodiment, a device for shifting voltage levels includes input and output stages and first and second sets of cascodes. The input stage includes multiple input transistors connected to a first voltage, the input stage receiving a differential input signal having input voltage levels. The output latch including multiple output transistors connected to a second voltage different from the first voltage, the output latch outputting a differential output signal having shifted voltage levels different from the corresponding input voltage levels. The first set of cascodes is connected to the input stage and includes first cascode transistors gated to a third voltage between the first and second voltages. The second set of cascodes is connected between the first set of cascodes and the output latch and includes second cascode transistors gated to the third voltage level. The first and second sets of cascodes prevent excessive voltage across terminals of the input transistors and the output transistors.

In another representative embodiment, a device for shifting voltage levels includes first and second input transistors, first and second output transistors and first and second sets of cascodes. The first input transistor includes a source connected to a first voltage, a drain connected to an input node, and a gate connected to an input for receiving an input signal, and the second input transistor includes a source connected to the first voltage, a drain connected to a complementary input node, and a gate connected to a complementary input for receiving a complementary input signal. Each of the input signal and the complementary input signal includes an initial level. The first output transistor includes a source connected to a second voltage different from the first voltage, a gate connected to an output node for outputting an output signal, and a drain connected to a complementary output node for outputting a complementary output signal, where each of the output signal and the complementary output signal includes a shifted level different than the initial level. The second output transistor includes a source connected to the second voltage, a gate connected to the complementary output node, and a drain connected to the output node. The first cascode set includes first and second cascode transistors, the first cascode transistor including a source connected to the input node and a gate connected to a third voltage having a value between the first voltage and the second voltage, and second cascode transistor including a source connected to the complementary input node and a gate connected to the third voltage. The second cascode set includes third and fourth cascode transistors, the third cascode transistor including a source connected to the complementary output node, a drain connected to a drain of the first cascode transistor and a gate connected to the third voltage, and the fourth cascode transistor including a source connected to the output node, a drain connected to a drain of the second cascode transistor and a gate connected to the third voltage.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such apparatuses methods are clearly within the scope of the present teachings.

Figure 1:
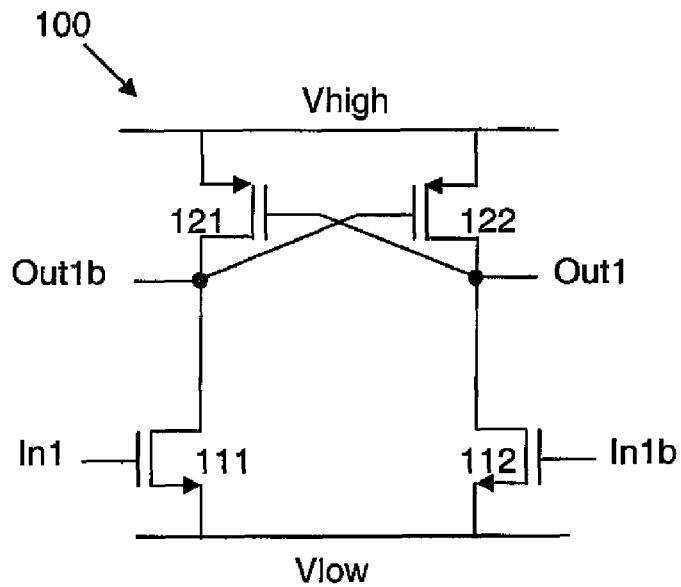
FIG. 1 is a block diagram illustrating a conventional level shifter.
Figure 2:
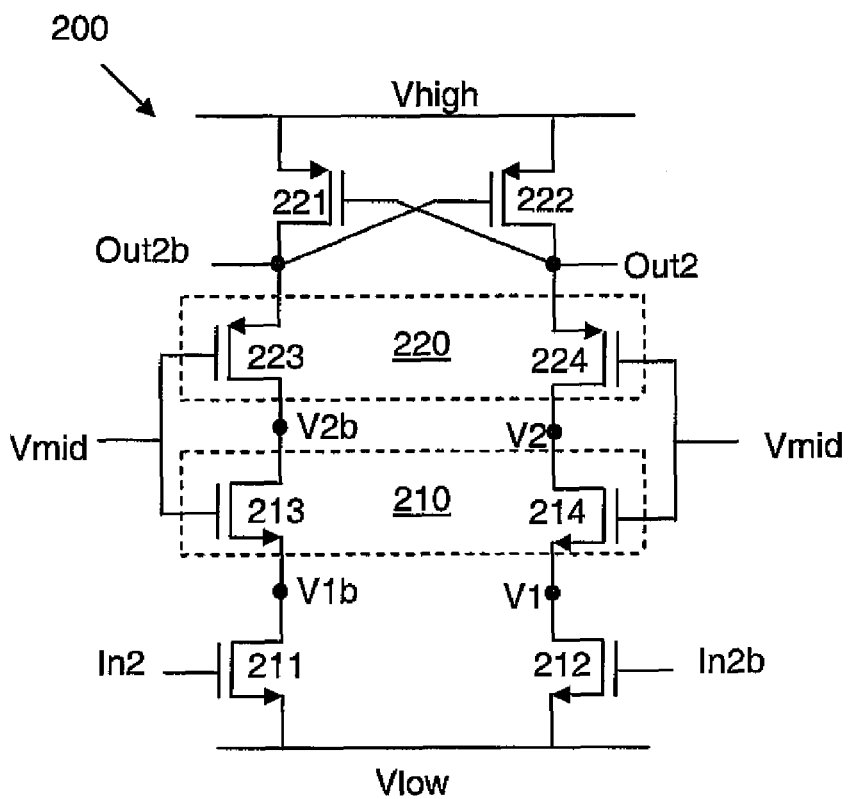
FIG. 2 is a block diagram illustrating a level shifter, according to a representative embodiment.

FIG. 2 is a block diagram showing a voltage level shifter or level translator, according to an illustrative embodiment. In particular, FIG. 2 shows an exemplary voltage shifter 200 having two sets of cascodes 210 and 220, inserted between input and output stages and gated to a mid-level voltage, to prevent excessive voltage across transistor terminals, discussed below.

Referring to FIG. 2, the level shifter 200 is connected to a high voltage source which provides high level voltage Vhigh and a low voltage source which provides low level voltage Vlow. The level shifter 200 includes transistors 211 and 212 in an input stage having one conductivity type and transistors 221 and 222 in an output stage having a different conductivity type. The transistors 221 and 222 form a latch. In the illustrative embodiment shown in FIG. 2, the transistors 211 and 212 are NMOS transistors and the transistors 221 and 222 are PMOS transistors, for example.

Transistor 211 includes a source connected to Vlow, a drain connected to complementary first input node V1b and a gate connected to input In2, and transistor 212 includes a source connected to Vlow, a drain connected first input node V1 and a gate connected to complementary input In2b. Transistor 221 includes a source connected to Vhigh, a gate connected to output Out2 and a drain connected to complementary output Out2b, and transistor 222 includes a source connected to Vhigh, a gate connected to complementary output Out2b and a drain connected to output Out2. The input In2 and the complementary input In2b receive differential input signals, i.e., signals 180 degrees out of phase, and the output Out2 and the complementary output Out2b output differential output signals, i.e., signals 180 degrees out of phase, corresponding to the differential input signals and having shifted voltage levels.

In addition, the level shifter 200 includes first and second cascode sets 210 and 220. The first cascode set 210 includes transistors 213 and 214 having the same conductivity type as transistors 211 and 212, and the second cascode set 220 includes transistors 223 and 224 having the same conductivity type as transistors 221 and 222. For example, in the depicted embodiment, the first cascode set 210 includes NMOS transistors 213 and 214, and the second cascode set 220 includes PMOS transistors 223 and 224.

Transistor 214 includes a source connected to first input node V1, a drain connected to second node V2 and a gate connected to a middle voltage source providing mid-level voltage Vmid, and transistor 213 includes a source connected to complementary first input node V1b, a drain connected to complementary second node V2b and a gate connected to the mid-level voltage Vmid. Transistor 224 includes a source connected to output Out2, a drain connected to second node V2 and a gate connected to the mid-level voltage Vmid, and transistor 223 includes a source connected to complementary output Out2b, a drain connected to complementary second node V2b and a gate connected to the mid-level voltage Vmid.

Vmid is a voltage at a level between the voltage levels of Vhigh and Vlow. The middle voltage source may supply Vmid independently, or may down-convert or up convert Vmid from Vhigh or Vlow. For example, Vmid may be a voltage level half way between the voltage levels of Vhigh and Vlow. Of course, it is understood that various embodiments may include any combination of high, low and mid-level voltages, without departing from the spirit and scope of the present teachings. The actual voltage level values may vary to provide unique benefits for any particular situation or to meet application specific design requirements of various implementations, as would be apparent to one skilled in the art.

The first cascode set 210 protects transistors 211 and 212, never allowing the voltages at the first input nodes V1/V1b to exceed the value of Vmid. The second cascode set 220 protects transistors 221 and 222, never allowing the voltages at outputs Out2/Out2b go below the value of Vmid+Vt, where Vt is a threshold voltage of each of the transistors 221 and 222. Also, even though the voltages at the second nodes V2/V2b may swing between Vlow and Vhigh, the transistors of the first and second cascode sets 210 and 220 (e.g., transistors 213, 214, 223 and 224) are protected from overstress by Vmid.

It is understood that the sizes of the transistors 211-214 and 221-224 may vary to provide unique benefits for any particular situation or to meet application specific design requirements of various implementations, as would be apparent to one skilled in the art. However, in an embodiment, the cross-coupled output stage transistors (transistors 221 and 222) are weaker than the input stage transistors (transistors 211 and 212). For instance, assuming that transistors 211, 212, 221 and 222 have the same length, the width of each transistor 221, 222 would be less than the width of each transistor 211, 212. That is, assuming the width of each transistor 221, 222 is w, the width of each transistor 211, 212 may be approximately 2 w-5 w, for example.

In addition, the transistors 211-214 and 221-224 may be field-effect transistors (FETs), such as metal-oxide FETs (MOSFETs), for example. However, other types of FETs and/or other types of transistors within the purview of one of ordinary skill in the art may be incorporated into the level shifter 200, without departing from the spirit and scope of the present teachings. For example, the transistors may 211-214 and 221-224 include gallium arsenide FETs (GaAsFETs), silicon bipolar junction transistors (BJTs), high electron mobility transistors (HEMTs), pseudomorphic HEMTs, heterostructure FETs (HFETs), junction-gate FETs (JFETs), metal-semiconductor FETs (MESFETs), etc. Further, it is understood that the sources/drains of the various transistors may be reversed, without affecting the relevant functionality of the exemplary level shifter 200, depending on design factors of various embodiments.

Referring again to FIG. 2, it may be assumed for purposes of illustration that Vhigh=3.3V, Vlow=−3.3V, and Vmid=0V, and that transistors 221 and 222 have a threshold voltage Vt=0.7V. In this representative case, when the input In2 receives a digital input signal having a swing of −3.3V to 0V, for example, the output Out2 provides a digital output signal having a swing of 0V(+0.7) to 3.3V. This allows for a level conversion of a −3.3V to 0V input signal to a 0V to 3.3V output signal using 5V tolerant transistors. As discussed below, in various embodiments, the initial output signal may actually swing from 0.7V to 3.3V, which is then converted to 0V to 3.3V by inverters coupled to outputs Out2/Out2*b*, thus removing the influence of the threshold voltage Vt.

In the depicted configuration, the voltage shifter 200 is fully differential and there is no static current dissipation. As stated above, Vmid can be set to any voltage between Vlow and Vhigh provided the relationships Vhigh-(Vmid+Vt) and Vmid-Vlow do not exceed the operating voltage limits of the transistors. The output swing of the output signal from output Out2 is determined by Vhigh and Vmid+Vt. Further, the input signal may include any swing that goes from Vlow to as high a voltage above Vlow as the transistors 211 and 212 are able to endure across their respective gate-source junctions. In various embodiments, one or two inverters (not shown) may be connected to the outputs Out2/Out2*b* so that the output signals swing more fully from Vhigh to Vmid.

Although FIG. 2 shows a voltage shifter that level shifts or translates up in voltage value (e.g., from −3.3V-0V to 0V-3.3V), the general topology discussed above may be used to level shift or translate down in voltage value, as well. For example, FIG. 3 is a block diagram showing a voltage shifter or translator, according to an illustrative embodiment, in which input signals are shifted down in voltage value.

Figure 3:
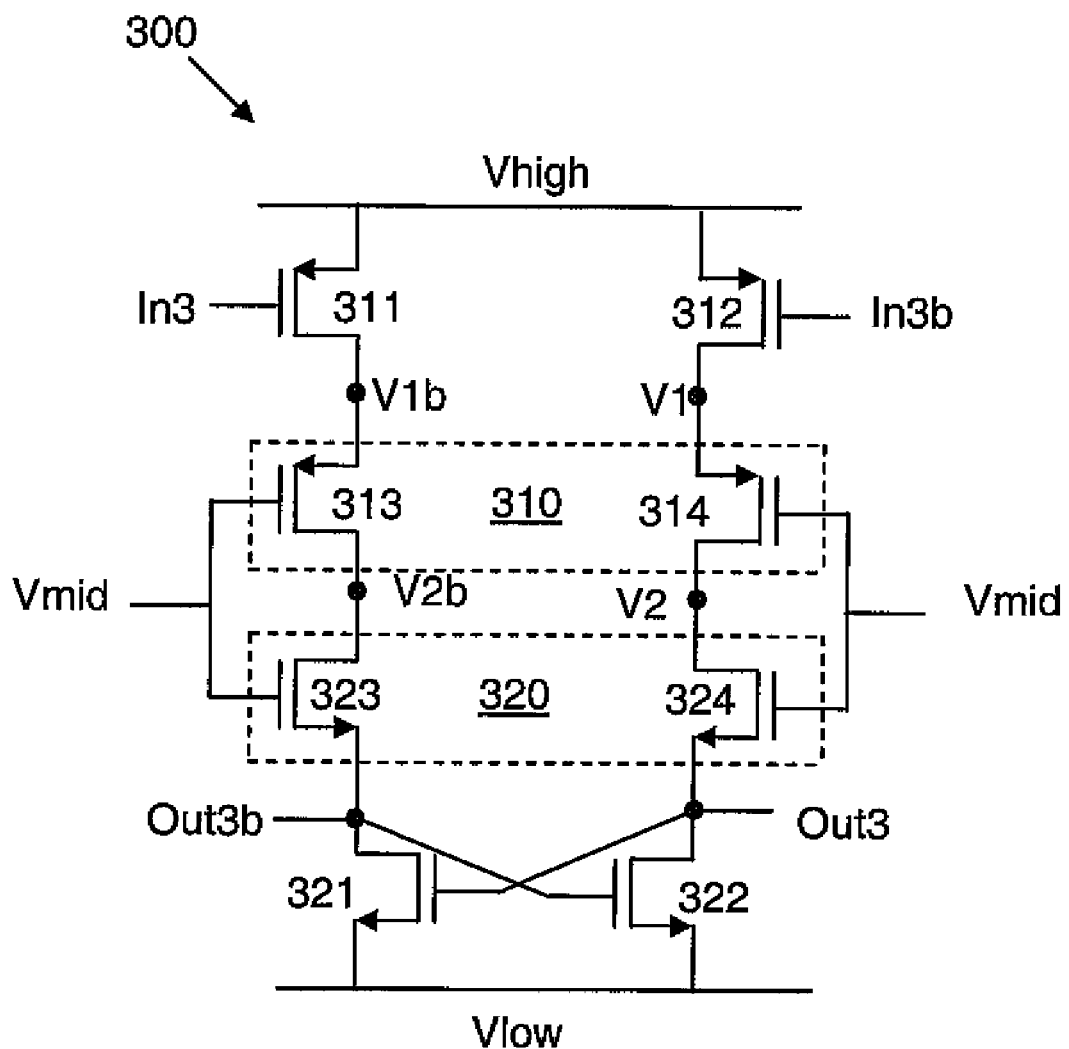
FIG. 3 is a block diagram illustrating a level shifter, according to a representative embodiment.

Referring to FIG. 3, the level shifter 300 is connected to a high voltage source which provides high level voltage Vhigh and a low voltage source with provides low level voltage Vlow. The level shifter 300 includes input stage transistors 311 and 312 having one conductivity type and output stage transistors 321 and 322 having another conductivity type. The transistors 321 and 322 form a latch. In the illustrative embodiment shown in FIG. 3, the transistors 311 and 312 are PMOS transistors and the transistors 321 and 322 are NMOS transistors.

Transistor 311 includes a source connected to Vhigh, a drain connected to complementary first input node V1*b* and a gate connected to input In3, and transistor 312 includes a source connected to Vhigh, a drain connected first input node V1 and a gate connected to complementary input In3*b*. Transistor 321 includes a source connected to Vlow, a gate connected to output Out3 and a drain connected to complementary output Out3*b*, and transistor 322 includes a source connected to Vlow, a gate connected to complementary output Out3 and a drain connected to output Out3. The input In3 and the complementary input In3*b* receive differential input signals, i.e., signals 180 degrees out of phase, and the output Out3 and the complementary output Out3*b* output differential output signals, i.e., signals 180 degrees out of phase, corresponding to the differential input signals and having shifted voltage levels.

In addition, the level shifter 300 includes first and second cascode sets 310 and 320. The first cascode set 310 includes transistors 313 and 314 having the same conductivity type as input transistors 311 and 312, and the second cascode set 320 includes transistors 323 and 324 having the same conductivity type as transistors 321 and 322. For example, in the depicted embodiment, the first cascode set 310 includes PMOS transistors 313 and 314, and the second cascode set 320 includes NMOS transistors 323 and 324.

Transistor 314 includes a source connected to first input node V1, a drain connected to second node V2 and a gate connected to mid-level voltage Vmid, and transistor 313 includes a source connected to complementary first input node V1*b*, a drain connected to complementary second node V2*b* and a gate connected to the mid-level voltage Vmid. Transistor 324 includes a source connected to output Out3, a drain connected to second node V2 and a gate connected to the mid-level voltage Vmid, and transistor 323 includes a source connected to complementary output Out3*b*, a drain connected to complementary second node V2*b* and a gate connected to the mid-level voltage Vmid.

As discussed above, Vmid is a voltage at a level between Vhigh and Vlow, where the relationships Vhigh−Vmid and Vmid−(Vlow−Vt) do not exceed the operating voltage limits of the transistors. The actual voltage level values may vary to provide unique benefits for any particular situation or to meet application specific design requirements of various implementations, as would be apparent to one skilled in the art.

The first cascode set 310 protects transistors 311 and 312, never allowing the voltages at the first input nodes V1/V1*b* to exceed the value of Vmid. The second cascode set 320 protects transistors 321 and 322, never allowing the voltages at outputs Out3/Out3*b* to go above the value of Vmid−Vt, where Vt is a threshold voltage of each of the transistors 321 and 322. Also, even though the voltages at the second nodes V2/V2*b* may swing between Vhigh and Vlow, the transistors of the first and second cascode sets 310 and 320 (e.g., transistors 313, 314, 323 and 324) are protected from overstress by an appropriately selected Vmid.

It is understood that the sizes of the transistors 311-314 and 321-324 may vary to provide unique benefits for any particular situation or to meet application specific design requirements of various implementations, as would be apparent to one skilled in the art. However, in an embodiment, the cross-coupled output stage transistors (transistors 321 and 322) are weaker than the input stage transistors (transistors 311 and 312). For instance, assuming that transistors 311, 312, 321 and 322 have the same length, the width of each transistor 321, 322 would be less than the width of each transistor 311, 312. That is, assuming the width of each transistor 321, 322 is w, the width of each transistor 311, 312 may be approximately 2 w-5 w, for example.

In addition, the transistors 311-314 and 321-324 may be FETs, such as MOSFETs, GaAsFETs, BJTs, HEMTs, pseudomorphic HEMTs, HFETs, JFETs, MESFETs, etc., or other type of suitable transistor. Further, it is understood that the sources/drains of the various transistors may be reversed, without affecting the relevant functionality of the exemplary level shifter 300, depending on design factors of various embodiments.

Referring again to FIG. 3, it may be assumed for purposes of illustration that Vhigh=3.3V, Vlow=−3.3V, and Vmid=0V, and that transistors 321 and 322 have a threshold voltage Vt=0.7V. In this case, when the input In3 receives a digital input signal having a swing of 0V to 3.3V, for example, the output Out3 provides a digital output signal having a swing of −3.3V to 0V(−0.7V). This allows for a level conversion of a 0V to 3.3V input signal to a −3.3V to 0V output signal using 5V tolerant transistors. In various embodiments, the initial output signal may actually swing from −3.3V to −0.7V, which is then converted to −3.3V to 0V by inverters coupled to outputs Out2/Out2*b*, thus removing the influence of the threshold voltage Vt.

Figure 4:
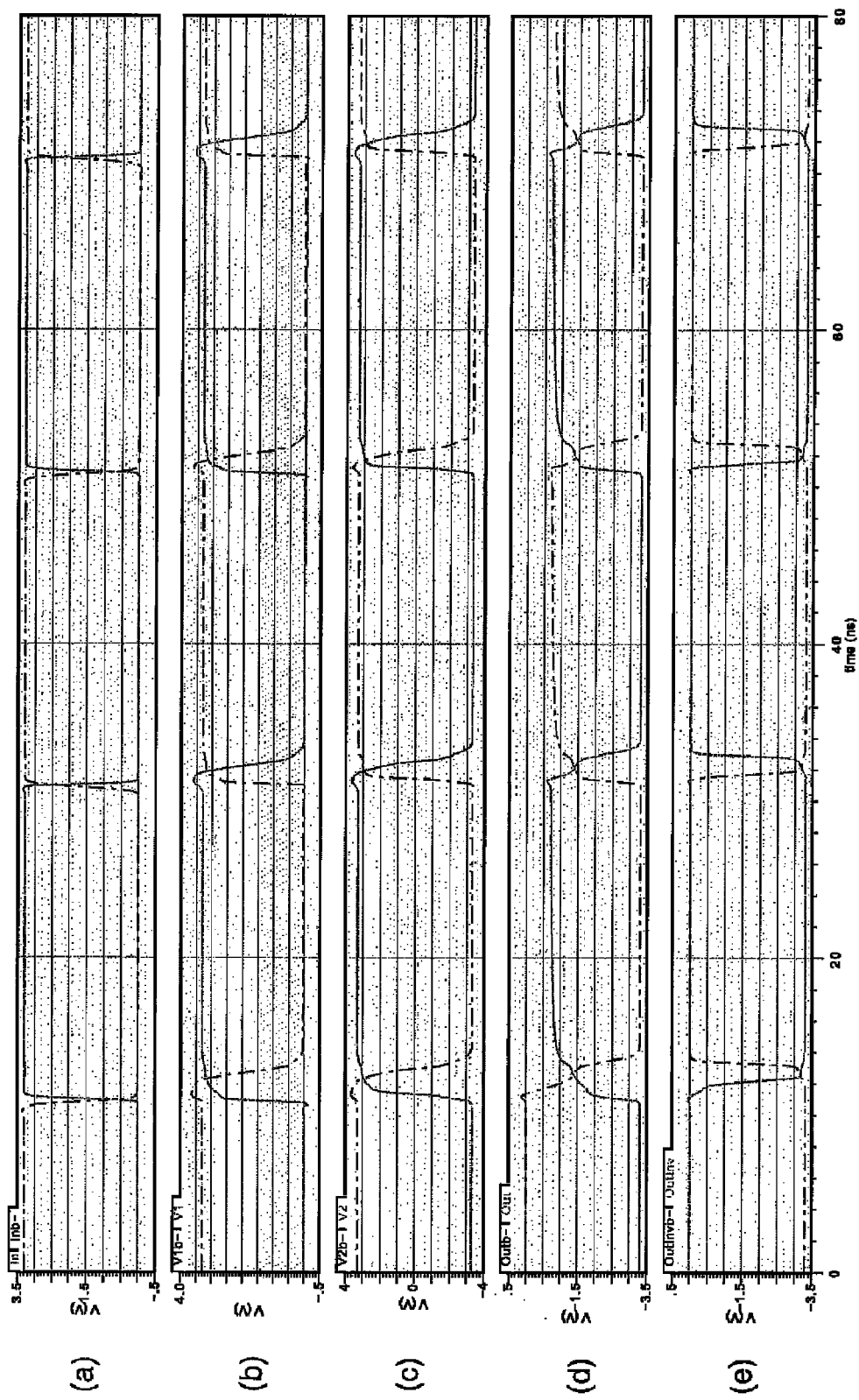
FIG. 4 is a series of graphs illustrating voltages of various signals of the level shifter of FIG. 3, according to a representative embodiment.

FIG. 4 is a series of graphs illustrating various voltage levels of the level shifter 300 of FIG. 3, according to a representative embodiment, indicating the transient response. Each of the graphs depicts voltage in the vertical axis and time in the horizontal axis. The graphs may be generated using a circuit simulator, e.g., available from Cadence Design Systems, Inc., and the example voltage levels discussed above (Vhigh=3.3V, Vlow=−3.3V, Vmid=0V, Vt=0.7).

Graph (a) of FIG. 4 shows voltage levels of illustrative input signal and complementary input signal received at inputs In3 and In3*b*, respectively, of the voltage shifter 300. The input signal received at the input In3 (indicated by the solid line) cycles from 0V to 3.3V, over a period of approximately 44 nsec. The complementary input signal (indicated by the dashed line) received at the input In3*b* cycles from 3.3V to 0V, over the same period.

Graph (b) shows voltage levels of signals at first input nodes V1/V1*b* in response to the input signals. The signal at the first input node V1 (indicated by the solid line) approximately cycles from 0V to 3.3V, over the same period as the signal at the complementary first input node V1*b* (indicated by the dashed line) approximately cycles from 3.3V to 0V in response to the input signals In3/In3*b*.

Graph (c) shows voltage levels of signals at second nodes V2/V2*b* in response to the input signals. The signal at the second node V2 (indicated by the solid line) approximately cycles from −3.3V to 3.3V, and the complementary second node V2*b* (indicated by the dashed line) approximately cycles from 3.3V to −3.3V, over the same period. Notably, when the voltage level at the second node V2 is 3.3V, the source to gate differential of transistor 314 is only 3.3V since Vmid is 0, and the source to drain differential is also 3.3V since the voltage level at input node V1 is 0V. Likewise, when the voltage level at the complementary second node V2*b* is 3.3V, the source to gate differential of transistor 313 is only 3.3V since Vmid is 0, and the source to drain differential is 0V since the voltage level at input node V1*b* is 3.3V.

Graph (d) shows voltage levels of output signals at outputs Out3/Out3*b* in response to the input signals. The signal at the output Out3 (indicated by the solid line) approximately cycles from −3.3V to −0.7V, and the signal at the complementary output Out3*b* (indicated by the dashed line) approximately cycles from −0.7 to −3.3V, over the same period. Notably, when the voltage level at the output Out3 is −3.3V, the source to gate differential of transistor 324 is only 3.3V since Vmid is 0, and the source to drain differential is approximately 0V since the voltage level at the second node V2 is also −3.3V at that time. When the voltage level at the output Out3 is −0.7V, the source to gate differential of transistor 324 is only 0.7V since Vmid is 0, and the source to drain differential is approximately 4.0V since the voltage level at the second node V2 is 3.3V at that time.

Graph (e) shows voltage levels of output signals from outputs Out3/Out3*b* after passing through corresponding inverters (not shown in FIG. 3). The inverters respectively provide opposite signal levels, as well as better defined signals (e.g., the signals more nearly approximate square waves and have a high level of 0V instead of −0.7V). Thus, the inverted signal Out3Inv from the output Out3 (indicated by the solid line) approximately cycles from 0V to −3.3V, and the inverted signal Out3Inv*b* from the complementary output Out3*b* (indicated by the dashed line) approximately cycles from −3.3V to 0V.

Accordingly, the input signal (e.g., received at input In3) is shifted from a range of 0V to 3.3V to an output signal (e.g., following an inverter at output Out3) having a range of −3.3V to 0V. Likewise, the complementary input signal (e.g., received at complementary input In3*b*) is shifted from a range of 3.3V to 0V to a complementary output signal (e.g., following an inverter at output Out3*b*) having a range of 0V to −3.3V.

Figure 5:
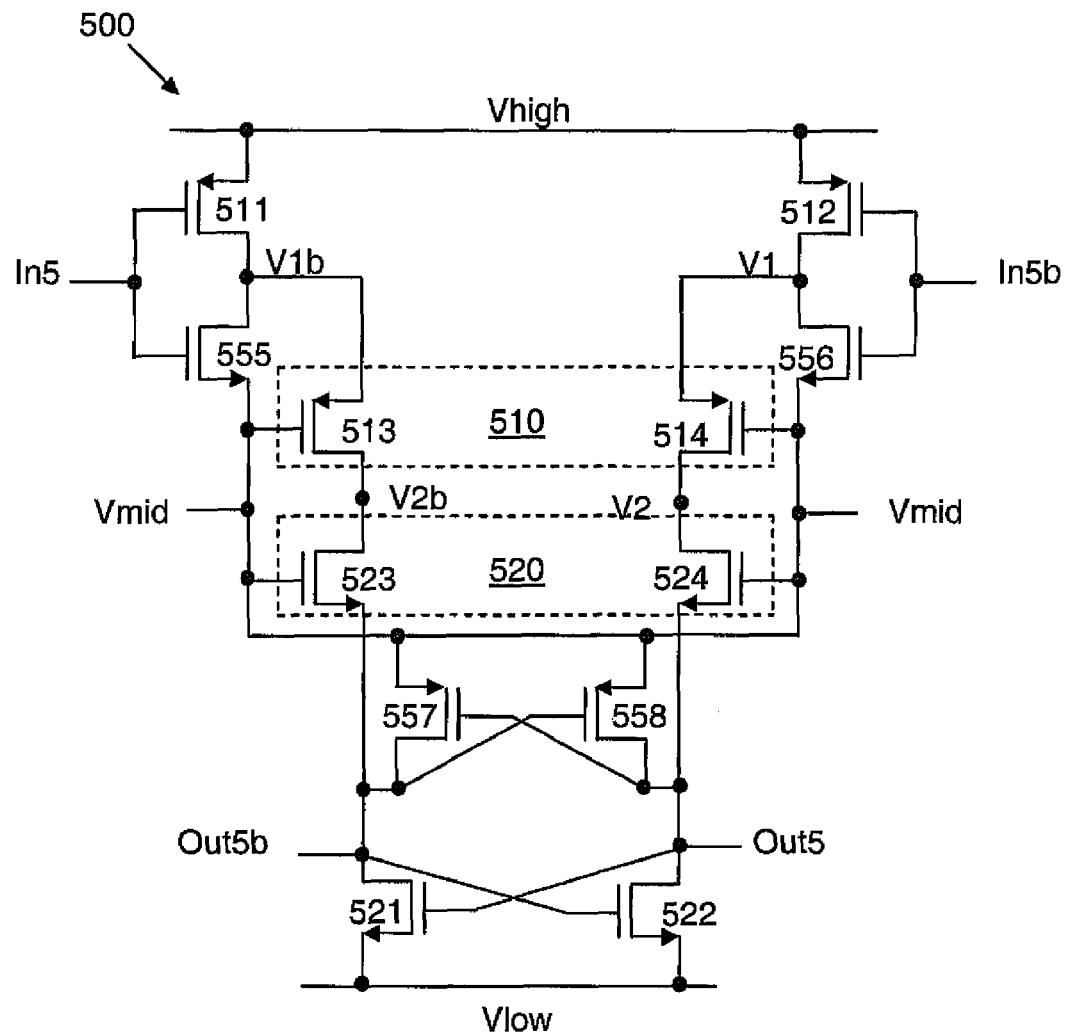
FIG. 5 is a block diagram illustrating a level shifter, according to a representative embodiment.

FIG. 5 is a block diagram showing a voltage shifter or translator, according to an illustrative embodiment. In particular, FIG. 5 shows an exemplary voltage shifter 500 having two sets of cascodes 510 and 520, positioned between input and output stages and gated to a mid-level voltage, to prevent excessive voltage across transistor terminals. In addition, the voltage shifter 500 includes an inverter (transistors 555 and 556) positioned between inputs In5/In5*b* and the first set of cascodes 510, as well as a latch (transistors 557 and 558) positioned between the second set of cascodes 520 and the outputs Out5/Out5*b*.

The configuration of the level shifter 500 shown in FIG. 5 forces defined start states, e.g., at first nodes V/V1*b* and outputs Out5/Out5*b*, and otherwise prevents glitches. It also allows for the outputs Out5/Out5*b* to swing from Vlow to Vmid. In comparison, upon start-up of the circuit shown in FIG. 3, for example, it is possible for the level shifter 300 to come up in an undefined state, which is not resolved until the first signals are fed through the level shifter 300. Also, in comparison, the outputs Out3/Out3*b* swing from Vlow to Vmid−Vt.

Referring to FIG. 5, the level shifter 500 is connected to a high voltage source which provides high level voltage Vhigh and a low voltage source which provides low level voltage Vlow. The level shifter 500 includes input stage transistors 511 and 512 having one conductivity type and output stage transistors 521 and 522 having a different conductivity type. The transistors 521 and 522 form an output latch. In the illustrative embodiment shown in FIG. 5, the transistors 511 and 512 are PMOS transistors and the transistors 521 and 522 are NMOS transistors.

Transistor 511 includes a source connected to Vhigh, a drain connected to complementary first input node V1*b* and a gate connected to input In5, and transistor 512 includes a source connected to Vhigh, a drain connected first input node V1 and a gate connected to complementary input In5*b*. Transistor 521 includes a source connected to Vlow, a gate connected to output Out5 and a drain connected to complementary output Out5*b*, and transistor 522 includes a source connected to Vlow, a gate connected to complementary output Out5*b* and a drain connected to output Out5. The input In5 and the complementary input In5*b* receive differential input signals, i.e., signals 180 degrees out of phase, and the output Out5 and the complementary output Out5*b* output differential output signals, i.e., signals 180 degrees out of phase, corresponding to the differential input signals and having shifted voltage levels.

In addition, the level shifter 500 includes first and second cascode sets 510 and 520. The first cascode set 510 includes transistors 513 and 514 having the same conductivity type as transistors 511 and 512, and the second cascode set 320 includes transistors 523 and 524 having the same conductivity type as transistors 521 and 522. For example, in the depicted embodiment, the first cascode set 510 includes PMOS transistors 513 and 514, and the second cascode set 520 includes NMOS transistors 523 and 524.

Transistor 514 includes a source connected to first input node V1, a drain connected to second node V2, and a gate connected to mid-level voltage Vmid and inverter transistor 556. Transistor 513 includes a source connected to complementary first input node V1b, a drain connected to complementary second node V2b, and a gate connected to the mid-level voltage Vmid and inverter transistor 555. Transistor 524 includes a source connected to complementary output Out5b and latch transistors 557 and 558, a drain connected to second node V2, and a gate connected to the mid-level voltage Vmid and inverter transistor 556. Transistor 523 includes a source connected to output Out5 and latch transistors 557 and 558, a drain connected to complementary second node V2b, and a gate connected to the mid-level voltage Vmid and inverter transistor 555.

More particularly, the state defining inverter includes inverter transistors 555 and 556. Transistor 555 includes a gate connected to the input In5, a drain connected to the first complementary input node V1, and a source connected to the gates of transistors 513 and 523 and the sources of latch transistors 557 and 558. Transistor 556 includes a gate connected to the complementary input In5, a drain connected to the first input node V1, and a source connected to the gates of transistors 514 and 524 and the sources of latch transistors 557 and 558. In an embodiment, the inverter transistors 555 and 556 have the opposite conductivity type as input transistors 511 and 512. For example, in the depicted embodiment, the inverter transistors 555 and 556 are NMOS transistors. The inverter transistors 555 and 556 force the input node V1 and complementary input node V1b to opposite states, for example, at start up.

The state defining latch includes latch transistors 557 and 558. Transistor 557 includes a gate connected to output Out5, a drain connected to complementary output Out5b, and a source connected to Vmid and the source of inverter transistor 555. Transistor 558 includes a gate connected to complementary output Out5b, a drain connected to output Out5, and a source connected to Vmid and the source of inverter transistor 556. In an embodiment, the latch transistors 557 and 558 have the opposite conductivity type as output transistors 521 and 522. For example, in the depicted embodiment, the latch transistors 557 and 558 are PMOS transistors. The state defining latch transistors 557 and 558 force the output Out5 and the complementary output Out5b to opposite states, for example, at start up. The state defining latch transistors 557 and 558 also force Out5/Out5b to swing from Vlow to Vmid.

As discussed above, Vmid is a voltage at a level between Vhigh and Vlow, where the relationships Vhigh−Vmid and Vmid−Vlow do not exceed the operating voltage limits of the transistors. The actual voltage level values may vary to provide unique benefits for any particular situation or to meet application specific design requirements of various implementations, as would be apparent to one skilled in the art. Also as discussed above, the first cascode set 510 protects transistors 511 and 512, never allowing the voltages at the first input nodes V1/V1b to exceed the value of Vmid. The second cascode set 520 protects transistors 521 and 522, never allowing the voltages at outputs Out5/Out5b to go below the value of Vmid. Also, even though the voltages at the second nodes V2/V2b may swing between Vhigh and Vlow, the transistors of the first and second cascode sets 510 and 520 (e.g., transistors 513, 514, 523 and 524) are protected from overstress by Vmid.

It is understood that the sizes of the transistors 511-314, 521-524 and 555-558 may vary to provide unique benefits for any particular situation or to meet application specific design requirements of various implementations, as would be apparent to one skilled in the art. However, in an embodiment, the cross-coupled output stage transistors (transistors 521 and 522) are weaker than the input stage transistors (transistors 511 and 512), as discussed above with respect to transistors 311, 312, 321 and 322.

Further, the state defining inverter and latch transistors (transistors 555-558) are included to ensure initially correct states of the level shifter 500. Accordingly, the transistors 521-522 and 557-558 are weaker than each of the other transistors in the circuit (transistors 511-514, 523-524, and 555-556). In addition, the state defining latch transistors 557 and 558, in particular, must be weak enough that the output latch, which includes output transistors 521 and 522, controls the output state of the level shifter 500. For example, assuming that transistors 511, 512, 521, 522, 557 and 558 have the same length, and that the width of each transistor 557, 558 is $w_1$, the width of each transistor 521, 522 may be approximately $2\,w_1$ and the width of each transistor 511, 512 may be approximate $4\,w_1$ to $6\,w_1$.

In addition, the transistors 511-314, 521-524 and 555-558 may be FETs, such as MOSFETs, GaAsFETs, BJTs, HEMTs, pseudomorphic HEMTs, HFETs, JFETs, MESFETs, etc., or other type of suitable transistor. Further, it is understood that the sources/drains of the various transistors may be reversed, without affecting the relevant functionality of the exemplary level shifter 500, depending on design factors of various embodiments.

The illustrative embodiments enable shifting an input signal voltage levels without overstressing transistors of the level shifter by excessive voltage at the respective gate/source junctions. Accordingly, the level shifter is more robust and reliable.

In view of this disclosure it is noted that variant level shifters and the like can be implemented in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A device for shifting voltage levels, comprising:
an input stage comprising a plurality of input transistors connected to a first voltage and an input for receiving an input signal;
an output stage comprising a plurality of output transistors directly connected to a second voltage and an output for outputting an output signal having a voltage level different from a corresponding voltage level of the input signal;
a plurality of cascode sets, connected between the input stage and the output stage, each cascode set comprising a corresponding plurality of cascode transistors gated to a third voltage, between the first voltage and the second voltage, preventing excessive voltage across terminals of the input transistors and the output transistors;
an inverter connected between the input stage and the plurality of cascode sets, the inverter forcing a plurality of input nodes corresponding to drains of the plurality of input transistors into opposite states at start up; and
a state latch connected between the output stage and the plurality of cascode sets, the latch forcing a plurality of output nodes corresponding to the output and a complementary output into opposite states at start up.

2. The device of claim 1, wherein the plurality of output transistors comprise an output latch.

3. The device of claim 2, wherein the output transistors are weaker than the input transistors.

4. The device of claim 1, wherein the first voltage is greater than the second voltage.

5. The device of claim 4, wherein the input transistors and the cascode transistors of the cascode set connected to the input stage comprise PMOS transistors, and
   wherein the output transistors comprise NMOS transistors and the cascode transistors of the cascode set connected to the output stage comprise NMOS transistors.

6. The device of claim 1, wherein the second voltage level is greater than the first voltage level.

7. The device of claim 6, wherein the input transistors and the cascode transistors of the cascode set connected to the input stage comprise NMOS transistors, and
   wherein the output transistors and the cascode transistors of the cascode set connected to the output stage comprise PMOS transistors.

8. The device of claim 1, wherein the state latch comprises a plurality of transistors that are weaker than the plurality of output transistors, so that the plurality of output transistors control a state of the output signal.

9. The device of claim 1, wherein the input signal transitions between the first voltage and the third voltage, and the output signal transitions between the second voltage and the third voltage.

10. The device of claim 1, wherein the plurality of cascode transistors of the cascode set connected to the input stage comprise one conductivity type, and the plurality of cascode transistors of cascode set connected to the output stage comprise another conductivity type.

11. The device of claim 10, wherein the input transistors have the same conductivity type as the cascode transistors of the cascode set connected to the input stage, and the output transistors have the same conductivity type as the cascode transistors of the cascode set connected to the output stage.

* * * * *